United States Patent
Schaeffer et al.

[19]

[11] Patent Number: 6,123,997
[45] Date of Patent: *Sep. 26, 2000

[54] METHOD FOR FORMING A THERMAL BARRIER COATING

[75] Inventors: Jon C. Schaeffer, Milford; William B. Connor, Mason, both of Ohio; Robert D. Field, Los Alamos, N. Mex.

[73] Assignee: General Electric Company, Cincinnati, Ohio

[*] Notice: This patent is subject to a terminal disclaimer.

[21] Appl. No.: 08/950,665

[22] Filed: Oct. 15, 1997

Related U.S. Application Data

[60] Continuation-in-part of application No. 08/819,344, Mar. 18, 1997, Pat. No. 5,780,110, which is a division of application No. 08/577,169, Dec. 22, 1995, abandoned.

[51] Int. Cl.[7] .................. B05D 3/02; C23C 14/00
[52] U.S. Cl. ............. 427/383.7; 427/343; 427/528; 427/531; 427/250; 427/255.4; 427/255.7; 427/419.3; 427/405
[58] Field of Search .................. 427/318, 343, 427/319, 383.7, 327, 337, 528, 531, 250, 405, 255.4, 255.7, 419.2, 419.3

[56] References Cited

U.S. PATENT DOCUMENTS

| | | | |
|---|---|---|---|
| 4,055,705 | 10/1977 | Stecura et al. | 428/633 |
| 4,095,003 | 6/1978 | Weatherly et al. | 427/34 |
| 4,321,310 | 3/1982 | Ulion et al. | 428/612 |
| 4,321,311 | 3/1982 | Strangman | 425/623 |
| 4,335,190 | 6/1982 | Bill et al. | 428/623 |
| 4,401,697 | 8/1983 | Strangman | 427/250 |
| 4,485,151 | 11/1984 | Stecura | 428/633 |
| 4,490,191 | 12/1984 | Hale | 148/31.5 |
| 4,851,300 | 7/1989 | Przbyszewski | 428/623 |
| 4,880,614 | 11/1989 | Strangman et al. | 428/623 |
| 4,900,640 | 2/1990 | Bell et al. | 428/633 |
| 4,916,022 | 4/1990 | Solfest et al. | 428/623 |
| 4,966,820 | 10/1990 | Kojima et al. | 428/622 |
| 5,015,502 | 5/1991 | Strangman et al. | 427/248.1 |
| 5,645,893 | 7/1997 | Rickerby et al. | 427/405 |

*Primary Examiner*—Roy V. King
*Attorney, Agent, or Firm*—Andrew C. Hess; David L. Narciso

[57] ABSTRACT

A thermal barrier coating system and a method for forming the coating system which yields a thermal barrier coating having good adhesion to a bond coat overlying a metal superalloy substrate. The adhesion of the bond coat and the thermal barrier coating is enhanced by forming a mature α-alumina ($Al_2O_3$) scale at the bond coat-TBC interface. The desired mature α-alumina scale can be obtained by utilizing one or more of the following steps: preoxidation of the bond coat at certain minimum temperatures and durations; inoculation of the surface of the bond coat; surface doping or alloying of the bond coat surface; and the addition of noble metals to the bond coat. Each of these steps promotes the formation of α-alumina and avoids the formation of the γ, δ and θ-alumina phases which undergo phase transformations at elevated temperatures, with the result that a more spallation-resistant thermal barrier coating system is obtained.

25 Claims, 1 Drawing Sheet

METHOD FOR FORMING A THERMAL BARRIER COATING

CROSS REFERENCE TO RELATED APPLICATIONS

This is a continuation-in-part patent application of U.S. patent application Ser. No. 08/819,344, filed Mar. 18, 1997, now U.S. Pat. No. 5,780,110 which is a divisional application of Ser. No. 08/577,169, filed Dec. 22, 1995, now abandoned.

FIELD OF THE INVENTION

The present invention relates to protective coatings for components exposed to high temperatures, such as components of a gas turbine engine. More particularly, this invention is directed to a process for forming a more durable thermal barrier coating system on a substrate by forming a layer of predominantly α-alumina on an aluminum-containing bond coat that serves to adhere a thermal-insulating layer to the substrate.

BACKGROUND OF THE INVENTION

As is well known, the power and efficiency of gas turbine engines typically increase with increasing nominal operating temperature, but the ability of the turbine to operate at increasingly higher temperatures is limited by the ability of the turbine components, especially the vanes and blades, to withstand the heat, oxidation and corrosion effects of the impinging hot gas stream and still maintain sufficient mechanical strength. Thus, there exists a continuing need to find advanced material systems for use in components that will function satisfactorily in high performance gas turbines, which operate at higher temperatures and stresses.

One approach to providing improved turbine components is to fabricate a strong, stable substrate having the shape of the component, and cover the substrate with a thin protective coating that resists the oxidation and corrosion effects of the hot combustion gas stream. The underlying substrates, usually nickel-base or cobalt-base superalloy compositions, were at one time formed by common forging or simple casting procedures, but now improved performance results from use of cooled airfoils made by directional solidification. Even greater operating temperatures are possible by casting the substrate as a single crystal having no grain boundaries which might cause premature failure, and with the single crystal orientation selected to meet required creep-rupture and fatigue lives.

Insulative coatings further enhance turbine performance by reducing heat transfer into cooled airfoils, thereby reducing the requirement for cooling air, which is a performance penalty. Durability of turbine components is also enhanced by insulative coatings that minimize metal temperatures and thermal stresses in the superalloy component.

Coating systems for insulating gas turbine engine components typically include several layers of differing compositions and properties in order to provide an optimal combination of benefits. For example, one layer may be relatively thick and porous to provide an insulating effect but, by itself, offer little resistance to oxidation, erosion, and corrosion. Ceramic materials are the predominant choice for this insulating layer, referred to as a thermal barrier coating (TBC). The outer surface of such a layer may be protected from erosion by providing a thin, hard, dense surface layer. Generally, a thin metallic layer, termed a bond coat, is applied on the substrate to adhere a ceramic insulating layer and protect the substrate through formation of an adherent oxide scale, such as a layer of aluminum oxide (alumina), which resists the oxidizing effects of the hot combustion gas stream. Other elements present in the bond coat contribute to the ability of the protective ceramic coating to adhere to the substrate through many cycles of gas turbine startup and shut down.

The service life of a coating system as described above, conventionally termed a thermal barrier coating (TBC) system, is typically limited at high temperatures due to excessive growth of the oxide scale on the bond coat and flaws which develop within the interfacial zone between the metallic bond coat and insulative ceramic layer. Thermally-induced deterioration of the interfacial zone coupled with stresses induced by thermal transients, ceramic-superalloy thermal expansion mismatch, and oxide growth eventually leads to spalling of the insulative ceramic layer.

It should be apparent from the foregoing general discussion of the art that further improvements in both the effectiveness and useful life of thermal barrier coating systems are required in order to survive the increasingly severe operating conditions in high-performance gas turbine engines. Therefore, a general desire is to provide methods for improving the spallation-resistance of thermal barrier coating systems for gas turbine engine components by enhancing the adherence of the insulative coating to the bond coat.

SUMMARY OF THE INVENTION

The present invention provides a thermal barrier coating system and a method for forming the coating system which yields a thermal barrier coating (TBC) having good adhesion to an aluminum-containing bond coat overlying a metal substrate. The adhesion of the thermal barrier coating to the bond coat is achieved by the formation of a mature alumina ($Al_2O_3$) scale at the bond coat-TBC interface. As used herein, the term "mature" in reference to the alumina scale is used to denote a scale that is composed of at least 90% alpha-alumina (α-alumina) by volume, with little gamma (γ), delta (δ) and theta (θ) alumina. As is known in the art, γ, δ and θ-alumina (which have cubic, tetragonal and monoclinic crystal structures, respectively) naturally form on aluminum-containing bond coats due to epitaxial relationships between these phases and the bond coat. According to this invention, steps must be taken to promote the formation of α-alumina (which has a rhombohedral crystal structure) in order to produce a mature α-alumina scale that will enhance the adhesion of a ceramic thermal barrier coating.

The present invention entails forming the desired mature α-alumina by utilizing one or more of the following steps: (1) preoxidation of the bond coat at certain minimum temperatures and durations; (2) inoculation of the surface of the bond coat; (3) surface doping (alloying) of the bond coat surface; and (4) the addition of noble metals to the bond coat. Each of the above steps has been determined to promote the formation of α-alumina and avoid the formation of the γ, δ and θ-alumina phases which undergo phase transformations at elevated temperatures, with the result that a more spallation-resistant thermal barrier coating system is obtained.

Other objects and advantages of this invention will be better appreciated from the following detailed description.

DETAILED DESCRIPTION OF THE INVENTION

Figure 1:
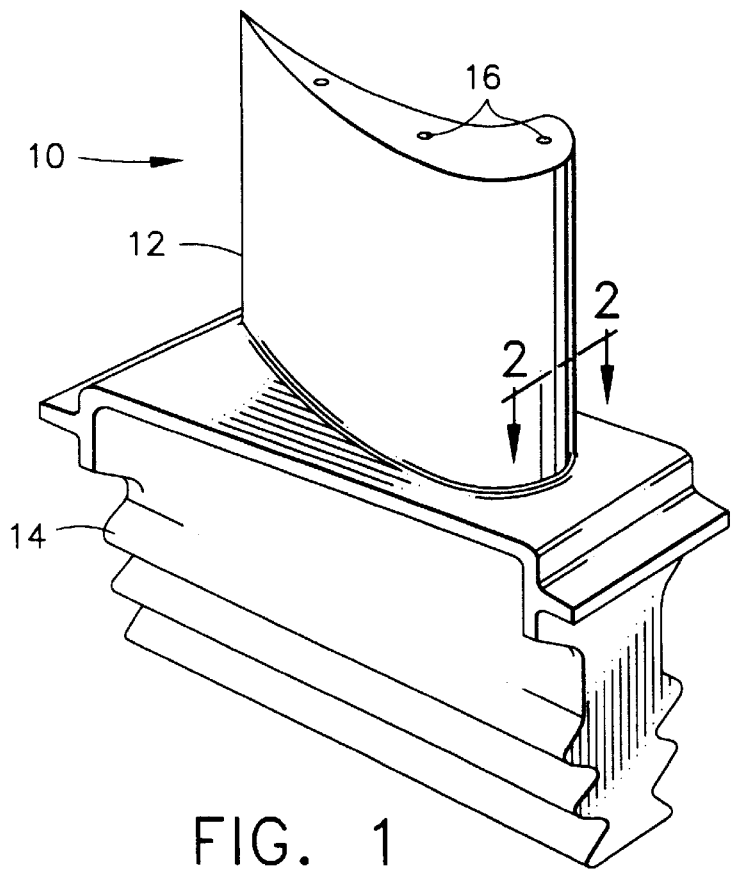
FIG. 1 is a perspective view of a turbine blade having a thermal barrier coating system according to the present invention.
Figure 2:
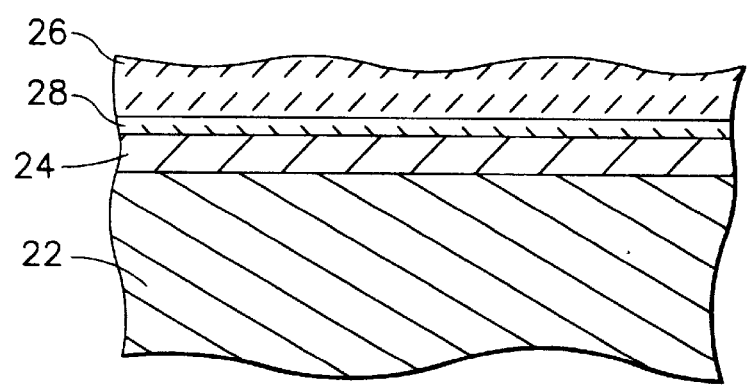
FIG. 2 is a cross-sectional view of the blade of FIG. 1 taken along line 2—2.

Shown in FIGS. 1 and 2 is a turbine blade 10 whose metal substrate 22 is protected by a thermal barrier coating system that includes a thermal barrier coating 26 adhered to the substrate 22 by a metallic bond coat 24. The metal substrate 22 is preferably a nickel-base or a cobalt-base superalloy, though dispersion-strengthened alloys, composites, and directional eutectics may also be protected in accordance with the invention.

As shown in FIG. 2, the bond coat 24 includes a continuous adherent alumina scale 28 formed in situ on the bond coat 24 that adheres the thermal barrier coating 26, which generally has a particular columnar or lamellar morphology. The bond coat 24 is an aluminum-containing composition, such as an MCrAlY alloy having a broad composition of 10 to 30% chromium, 5 to 15% aluminum, 0.01 to 1% yttrium (or hafnium, lanthanum, cerium and scandium), the balance being M selected from the group consisting of iron, cobalt, nickel and mixtures thereof. Minor amounts of other elements may also be present. Such alloys are known in the prior art for use alone as a protective coating and are described in various U.S. patents, including U.S. Pat. Nos. 3,542,530, 3,676,085, 3,754,903 and 3,928,026, which are incorporated herein by reference. Also suitable are diffusion aluminide and platinum aluminide coatings such as that disclosed in U.S. Pat. No. 3,677,789 to Bungardt et al. and U.S. Pat. No. 4,880,614 to Strangman et al., which are incorporated herein by reference.

The bond coat 24 is preferably an aluminide diffusion coating such as platinum aluminide (PtAl), or an MCrAlY coating such as NiCrAlY or CoCrAlY deposited on the surface of the substrate 22 by plasma spraying as described in U.S. Pat. No. 4,055,705, incorporated herein by reference. However, it is contemplated that cladding, slurry spray, and sintering may be used for applying the bond coat 24 to the substrate 22. A bond coat 24 of NiCrAlY having a thickness between about 0.002 inches and 0.007 inch (about 50 to about 175 micrometers) has given satisfactory results, with a thickness of about 0.002 to about 0.004 inch (about 50 to 100 micrometers) being preferred. If a platinum aluminide or diffusion aluminide, the bond coat 24 may be applied or deposited by chemical vapor deposition (CVD) or pack cementation as set forth, for example, in Bungardt et al. and Strangman et al. A suitable bond coat 24 of platinum aluminide has a thickness of from 0.001 to 0.004 inch (about 25 to 100 micrometers).

Thermal barrier coatings are set forth in Kojima et al., U.S. Pat. No. 4,966,820, issued Oct. 30, 1990, which is incorporated herein by reference. Suitable materials for the thermal barrier coating 26 include ceramics containing zirconia ($ZrO_2$) stabilized or partially stabilized with yttria ($Y_2O_3$) (for example, 4 to 20 wt. %), MgO (for example, 4 to 24 wt. %) or CaO (for example, 4 to 8 wt. %) as a minor component. The thermal barrier coating 26 is preferably yttria-stabilized zirconia. A typical yttria-stabilized zirconia contains 6 to 30 weight percent yttria based on the total weight of zirconia and yttria, more preferably 6 to 20 weight percent yttria, and most preferably from 6 to 10 weight percent yttria. The thickness of the thermal barrier coating 26 may be about 25 to 1000 micrometers, and is preferably about 50 to 300 micrometers and more preferably about 75 to 225 micrometers. Suitable thermal barrier coatings are set forth in Strangman et al. cited above.

The thermal barrier coating 26 may be applied by thermal spray or electron beam physical vapor deposition (EBPVD). Sputter deposition of yttria-stabilized zirconia may be performed using a 10-centimeter diameter argon ion beam from an electron bombardment ion source of the type developed from electric propulsion technology. Such an ion source is described in "Advanced in Electronics and Electron Physics" by H. R. Kaufman, vol. 36, pages 365–373. Beam extraction may be accomplished by a dished, two-grid ion optics system. Such a system is described in AIAA Paper No. 76-1017 entitled "A 30 cm Diameter Argon Ion Source." Neutralization of the ion beam can be achieved by using a plasma bridge neutralizer.

Generally, thermal barrier coatings can be employed to protect various metal and ceramic substrates. As shown in FIG. 2, the thermal barrier coating 26 is applied as an overlay coating to the bond coat 24, which has been applied to and overlays the superalloy substrate 22 of the turbine blade 10 of FIG. 1. Though useful in any of a variety of applications to protect superalloy substrate-based components, the application referenced here is a thermal barrier coating system for a turbine blade of an aircraft gas turbine engine. Nickel-, cobalt- and iron-base superalloys are typical materials for the substrate 22 of the turbine blade 10. Suitable nickel-base superalloys contain, by weight, 40 to 80% nickel, 5 to 20% chromium, and may contain up to 10% molybdenum, up to 5.5% titanium, up to 6.5% aluminum, up to 3% columbium, up to 9% tantalum, up to 13.5% tungsten, up to 2% hafnium, up to 6% rhenium, up to 20% cobalt, and up to 3% iron. Nickel-base superalloys may also contain minor amounts of carbon, boron, zirconium, silicon and manganese. They are also likely to contain small amounts of undesirable impurities of sulfur, copper and phosphorus. Specific examples of suitable cobalt-base superalloys are set forth in U.S. Pat. No. 3,955,935 to Shockley et al., which is incorporated herein by reference.

Notable examples of superalloys for the blade 10 and substrate 22 include Rene' 80, a well known nickel-base superalloy which has a nominal composition, in weight percent, of 14 percent chromium, 9.5 percent cobalt, 5 percent titanium, 4 percent tungsten, 4 percent molybdenum, 3 percent aluminum, 0.17 percent carbon, 0.06 percent zirconium, 0.015 percent boron, and the balance nickel. Another example is a more advanced nickel-base superalloy such as Rene' N4, having a nominal composition, in weight percent, of 7.5 cobalt, 9.0 chromium, 3.7 aluminum, 4.2 titanium, 1.5 percent molybdenum, 4.0 percent tantalum, 6.0 percent tungsten, 0.5 percent columbium, and the balance nickel. A preferred material is Rene' N5, which is another well known commercially available alloy. These superalloys are presented as examples, and the teachings of this invention are not limited for use with substrates of these materials. The substrate 22 preferably has a thickness of greater than 20 mils (about 0.5 millimeter).

The alumina scale 28 formed on the bond coat 24 may have a thickness of about 0.01 to about 0.25 mils (about 0.25 to about 6 micrometers). In accordance with this invention, adhesion of the thermal barrier coating 26 to the bond coat 24 is promoted by forming the alumina scale 28 in a manner that assures the alumina scale 28 will be mature $\alpha$-alumina. As used herein, the term "mature" in reference to the alumina scale 28 denotes a scale that is composed of at least 90% $\alpha$-alumina by volume with little $\gamma$, $\delta$ and $\theta$-alumina, which have cubic, tetragonal and monoclinic crystal structures, respectively. $\gamma$, $\delta$ and $\theta$-alumina naturally form on aluminum-containing bond coats due to epitaxial relationships between these phases and such bond coats. According to this invention, it has been determined that TBC systems having an alumina scale of γ, δ and/or θ-alumina exhibit lower resistance to spallation during thermal cycling than do those having a mature α-alumina scale. Accordingly, this invention entails processes that promote the formation of α-alumina in order to improve the adhesion of the thermal barrier coating 26. Such steps include (a) preoxidation of the bond coat 24 under specified conditions, (b) inoculation of the bond coat 24, (c) surface doping or alloying of the bond coat 24, and (d) the addition of noble metals to the bond coat 24.

To be effective, preoxidation of the bond coat 24 to form a mature α-alumina scale 28 must occur under certain conditions before or during the deposition of the thermal barrier coating 26. Otherwise, γ, δ and θ-alumina will form on the bond coat 24. To obtain a mature α-alumina instead of γ, δ and θ-alumina, preoxidation is performed at temperatures above 1976° F. (about 1080° C.), more preferably above 2000° F. (about 1093° C.) up to about 2150° F. (about 1177° C.), for a duration of about two hours in an oxygen-rich environment. A duration of at least four hours is preferred for preoxidation treatments at the lower end of this temperature range, while durations of less than two hours are possible for preoxidation treatments at the upper end of the range. As used herein, the phrase "oxygen-rich" is understood to be relative to the partial pressure of oxygen required to form alumina on aluminum or an aluminum-containing substrate, e.g., the bond coat 24. As such, the phrase "oxygen-rich environment" denotes an atmosphere having an oxygen partial pressure greater than $10^{-33}$ atmosphere, and encompasses treatment environments of air, mixtures of carbon monoxide (CO) and carbon dioxide ($CO_2$), and mixtures of water vapor ($H_2O$) and hydrogen gas ($H_2$).

Thermal cycling during the preoxidation step is to be avoided to inhibit spallation of the alumina scale 28. Reduced pressure environments (e.g., a vacuum) are not necessary. To the contrary, preoxidation at pressures above one atmosphere, such as by autoclaving, can be advantageous to heal cracks and pores in the bond coat 24 and thermodynamically stabilize the low atomic volume α-alumina scale 28. Suitable autoclaving conditions are temperatures of about 2000° F. (about 1093° C.) to about 2100° F. (about 1149° C.) and pressures of about 1 to about 15 ksi (about 7 to about 103 MPa) for a duration of about two to four hours in an atmosphere of air or argon containing oxygen as an impurity, i.e., at a level sufficient to be qualified as "oxygen-rich" in accordance with the definition used herein.

Notably, U.S. Pat. No. 4,321,311 to Strangman discloses preoxidizing an MCrAlY bond coat to form an oxide scale prior to deposition of a ceramic thermal barrier coating. This process is described as being performed in a hydrogen atmosphere at about 1975° F. (about 1080° C.) or in air at 500° F. to 2000° F. (260° C. to about 1093° C.). In addition, European patent application EP0733723 discloses that α-alumina can be thermally grown in a "low partial pressure oxygen atmosphere" at temperatures above 1800° F. Cited examples of suitable atmospheres include a vacuum of less than $10^{-4}$ torr, or argon or hydrogen partial pressures having oxygen impurities, with a specific example being given as evacuating a vacuum furnace to $1\times10^{-6}$ torr and backfilling with argon having oxygen impurities to 10 torr, ramping to 1925° F., holding for one hour, and then cooling. However, according to this invention, none of the above treatments yields a mature α-alumina scale on an aluminum-containing bond coat, as required by this invention, because these treatments are either performed in an atmosphere that is not sufficiently oxygen-rich, or are not required to be performed at sufficient temperatures and for sufficient durations to yield a mature α-alumina scale, as the term "mature" is defined herein. In effect, the present invention has shown that temperatures of at least 2000° F. and durations of two hours or more are required to produce an alumina scale of at least 90% α-alumina by volume, and that such an alumina scale provides unexpectedly good results in terms of spallation resistance of a thermal barrier coating.

In contrast, the hydrogen atmosphere taught by Strangman is not oxygen-rich and therefore cannot be used to thermally grow a layer of mature α-alumina. While air is sufficiently oxygen-rich to form α-alumina, the investigation leading to this invention showed that mature α-alumina cannot be formed by preoxidation at temperatures of up to 1800° F. (about 982° C.) without an extended treatment, e.g., at least a few days at 1800° F. Accordingly, Strangman's preoxidation technique would not yield mature α-alumina in this range. While the investigation showed that preoxidation in air at temperatures of between 1800° F. and 2000° F. (about 982° C. and 1093° C.) will yield mature α-alumina in less than a few days, such investigations unexpectedly showed that treatments at temperatures above 2000° F. (above 1093° C.) in an oxygen-rich atmosphere produce a layer of mature α-alumina in as little as two hours. Though the European patent application makes the claim that α-alumina is obtained, insufficient α-alumina would be obtained by the disclosed process (one hour at 1925° F.) to qualify as "mature" (at least 90 percent α-alumina by volume) in accordance with this invention.

In summary, because the actual treatments performed by the prior art were inadequate, the prior art could not obtain or foresee the unexpectedly good results obtained by the preoxidation method of this invention. In particular, preoxidation in accordance with this invention at 2000° F. or more for durations of two hours or more have produced a mature α-alumina scale that has an extraordinary effect on the spallation resistance of a thermal barrier coating. As an example, preoxidation at about 2050° F. (about 1020° C.) for durations of four hours has been unexpectedly found to increase by 50% the spallation resistance of otherwise identical thermal barrier coating systems of the type represented in FIG. 2, as determined by furnace cycle testing. The tested specimens were formed of Rene' N5 nickel-base superalloy coated with a platinum aluminide (PtAl) bond coat having a thickness of about two to three mils (about 50 to about 75 micrometers).

After forming a mature α-alumina on a first group of the specimens (Group A) by preoxidizing in an oxygen-rich atmosphere at about 2050° C. for about four hours, an yttria-stabilized zirconia (YSZ) layer was deposited by electron beam physical vapor deposition (EBPVD) on all of the specimens to a thickness of about five mils (about 125 micrometers). During the EBPVD process, in which a temperature of about 1040° C. was sustained for about 0.4 hour, an alumina scale containing the γ, δ and θ-alumina phases (predominantly the γ-alumina phase) naturally developed on the specimens (Group B) that did not undergo preoxidation. The furnace cycle test entailed a soak at about 2075° F. (1135° C.) for about forty-five minutes, followed by fan cooling to about 200° F. (about 90° C.). Testing of a specimen was terminated when about 10% of its thermal barrier coating had spalled. The results of the test were that the Group B specimens exhibited an average thermal cycle life of 368 cycles, while the Group A specimens of this invention exhibited an average thermal cycle life of 550 cycles. An additional group of specimens similarly prepared (Rene N5', PtAl bond coat and EBPVD YSZ), one set of which was preoxidized at 2000° F. for about four hours, and then tested under the same conditions described above resulted in the preoxidized specimens remarkably exhibiting over twice the thermal cycle life of the baseline (non-preoxidized) specimens.

The above-noted improvements in spallation resistance were particularly unexpected and remarkable since one skilled in the art would think that depletion of aluminum from the bond coat by preoxidizing at the prescribed temperatures and durations would promote spallation by significantly increasing the initial thickness of the alumina scale. To the contrary, these tests showed that a considerably more durable thermal barrier coating system is obtained if a mature α-alumina scale is present between the bond coat and thermal barrier coating, instead of an alumina scale composed of the γ, δ and θ phases. The tests further showed that the type of alumina formed and spallation resistance are extremely sensitive to the temperature and time over which the alumina scale is formed.

For the purpose of producing a mature α-alumina, the present invention further encompasses the additional steps of inoculation, surface-doping and noble metal additions to promote the formation of α-alumina over the γ, δ and θ phases. Inoculation of the bond coat 24 to promote α-alumina formation can be achieved by placing, such as by slurry, internal oxidation, metallo organic chemical vapor deposition or EBPVD, a submicron dispersion of oxide particles on the bond coat surface to inoculate the bond coat oxide. The submicron oxides are chosen to act as nucleation sites, thus reducing kinetic barriers to the formation of α-alumina. Oxides with the same crystal structure of α-alumina are most effective for this purpose, examples of which are α-$Fe_2O_3$, $Y_2O_3$, $Cr_2O_3$ and of course α-alumina. Commercially-available examples of a suitable α-alumina inoculant are alumina polishing compounds whose particle size range is about 0.3 to 5 micrometers.

The slurry or inoculant should cover substantially all of the surface area on which a TBC is to be applied. The inoculated bond coat can then be preoxidized to form mature α-alumina, or the thermal barrier coating can be immediately deposited, with the process of TBC deposition and subsequent elevated in-service temperatures serving to oxidize the bond coat and form the desired mature α-alumina scale. Because the inoculants lower kinetic barriers to the formation of α-alumina, a mature α-alumina scale can be formed at lower temperatures and with shorter durations than that necessary to adequately form mature α-alumina if preoxidation alone is relied on. For example, preoxidation at 1900° F. (about 1038° C.) for as little as one hour can produce a mature α-alumina scale if the bond coat is adequately inoculated.

Surface doping of the bond coat 24 to obtain the desired mature α-alumina entails introducing into the bond coat 24 or otherwise alloying the bond coat 24 to contain elements that oxidize at a faster rate than alumina. Suitable techniques include thin plating, ion implantation, and sputtering to form oxides with the same crystal structure as α-alumina. Suitable elements for this purpose include but are not limited to iron, chromium and yttrium. As with an inoculated bond coat, the bond coat adequately surface-doped or alloyed in accordance with this invention can then be preoxidized to form mature α-alumina, or subsequent processing and in-service conditions can be relied on to form the desired mature α-alumina scale. A mature α-alumina scale can also be formed on the doped bond coat at lower temperatures and with shorter durations than that necessary with preoxidation alone, e.g., preoxidation at 1900° F. for greater than one hour.

Finally, the reduction in the amount of oxides other than alumina, such as NiO and $Cr_2O_3$, that form are believed to cause a faster transition to α-alumina formation. Noble metals that do not form stable solid oxides, and particularly platinum, would accomplish this feat, though it is foreseeable that other materials could be used for this purpose. The noble metal can be deposited to a thickness of not more than about ten micrometers by plating, ion implantation, sputtering, etc., and is preferably added to the bond coat prior to deposition of the TBC unless the bond coat is an aluminide coating, in which case the noble metal can be deposited directly on the substrate, both of which are then aluminized. Similar to the inoculation and surface-doping methods of this invention, a mature α-alumina scale can also be formed on the bond coat at lower temperatures and with shorter durations than that necessary with preoxidation alone, e.g., preoxidation at 1900° F. for greater than one hour.

In accordance with this invention, the above outlined techniques are capable of forming a mature α-alumina scale on an aluminum-containing bond coat, which substantially improves the adhesion of a thermal barrier coating to the bond coat. While the mechanism by which a mature α-alumina scale achieves a more spall-resistant TBC system is not clear, one possibility is that avoidance of γ, δ and θ-alumina also avoids the phase transformation of these phases to α-alumina during exposure to elevated temperatures, which in turn avoids tensile stresses induced at the bond coat-TBC interface as a result of a decrease in volume in the alumina scale. Accordingly, the advantages of the present invention appear to be the result of stabilizing a mature α-alumina scale on an aluminum-containing bond coat prior to deposition of the TBC.

While the invention has been described in terms of particular materials and processing steps, it is apparent that other forms could be adopted by one skilled in the art. Therefore, the scope of the invention is to be limited only by the following claims.

What is claimed is:

1. A method for forming a thermal barrier coating system, the method comprising the steps of:
   providing a substrate;
   applying an aluminum-containing metallic bond coat on the substrate;
   doping a surface of the bond coat with elements that oxidize at a faster rate than aluminum, the elements being selected from the group consisting of Fe, Cr and Y;
   oxidizing the metallic bond coat at a temperature above 2000° F. in an oxygen-rich environment for a duration sufficient to form a layer of at least 90% α-alumina by volume on the metallic bond coat; and then
   applying an insulative coating on the α-alumina layer.

2. The method of claim 1, wherein the metallic bond coat is oxidized for a duration of at least four hours.

3. The method of claim 1, wherein the metallic bond coat is selected from the group consisting of (i) aluminided MCrAlY where M is selected from the group consisting of Ni, Co and Fe, (ii) MCrAlY wherein M is selected from the group consisting of Ni, Co and Fe, (iii) a diffusion aluminide, and (iv) a platinum-modified diffusion aluminide.

4. The method of claim 1, wherein the insulative coating is yttria-stabilized zirconia.

5. The method of claim 1, wherein the oxidation step is performed at a pressure of greater than one atmosphere.

6. The method of claim 1, wherein the oxidation step is performed at a pressure of about 1 ksi to about 15 ksi.

7. The method of claim 1, further comprising the step of adding at least one noble metal to the bond coat prior to the oxidation step to enhance formation of α-alumina.

8. A method for forming a thermal barrier coating on a gas turbine engine component, the method comprising the steps of:

forming the component of a superalloy;

applying an aluminum-containing bond coat on a surface of the component;

doping a surface of the bond coat with elements that oxidize at a faster rate than aluminum, the elements being selected from the group consisting of Fe, Cr and Y;

oxidizing the bond coat at a temperature above 2000° F. for a duration of at least two hours in an oxygen-rich environment to form a mature α-alumina scale of at least 90% α-alumina by volume on the bond coat; and then applying an insulative ceramic coating on the α-alumina scale.

9. The method of claim 8, wherein the bond coat is oxidized at a temperature of above 2000° F. to about 2150° F.

10. The method of claim 8, wherein the bond coat is selected from the group consisting of (i) aluminided MCrAlY where M is selected from the group consisting of Ni, Co and Fe, (ii) MCrAlY wherein M is selected from the group consisting of Ni, Co and Fe, (iii) a diffusion aluminide, and (iv) a platinum-modified diffusion aluminide.

11. The method of claim 8, wherein the insulative ceramic coating is yttria-stabilized zirconia.

12. The method of claim 8, wherein the oxidation step is performed at a pressure of greater than one atmosphere.

13. The method of claim 8, wherein the oxidation step is performed at a pressure of about 1 ksi to about 15 ksi.

14. The method of claim 8, further comprising the step of adding at least one noble metal to the bond coat prior to the oxidation step to enhance formation of α-alumina.

15. A method for forming a thermal barrier coating on a gas turbine engine component, the method comprising the steps of:

forming the component of a superalloy;

forming a platinum aluminide bond coat on a surface of the component;

oxidizing the bond coat at a temperature of above 2000° F. to about 2150° F. and a pressure of about 1 ksi to about 15 ksi for a duration of about two to four hours in an oxygen-rich environment to form a mature α-alumina scale of at least 90% α-alumina by volume on the bond coat; and then applying an insulative ceramic coating on the α-alumina scale.

16. A method for forming a thermal barrier coating system, the method comprising the steps of:

providing a substrate;

forming an aluminum-containing metallic bond coat on the substrate;

adding at least one noble metal to the bond coat to enhance formation of α-alumina;

oxidizing the bond coat at a temperature above 2000° F. in an oxygen-rich environment for a duration of about one hour to form a layer of at least 90% α-alumina by volume on the metallic bond coat; and then applying an insulative coating on the bond coat.

17. The method of claim 16, wherein the at least one noble metal is selected from the group consisting of Pt, Rh, Re, Ir, Os, Ru and Pd.

18. The method of claim 16, wherein the at least one noble metal is added to the bond coat by plating, ion implantation or sputtering.

19. The method of claim 16, wherein the at least one noble metal is added to the bond coat as a layer having a thickness of not more than about ten micrometers.

20. The method of claim 16, wherein the at least one noble metal is added to the bond coat prior to applying the insulative coating.

21. The method of claim 16, wherein the bond coat is an aluminide bond coat, the at least one noble metal being deposited directly on the substrate, and then the subtrate and the at least one noble metal being aluminized to form the bond coat.

22. The method of claim 16, wherein the bond coat is selected from the group consisting of (i) aluminided MCrAlY where M is selected from the group consisting of Ni, Co and Fe, (ii) MCrAlY wherein M is selected from the group consisting of Ni, Co and Fe, (iii) a diffusion aluminide, and (iv) a platinum-modified diffusion aluminide.

23. The method of claim 16, wherein the insulative coating is yttria-stabilized zirconia.

24. The method of claim 16, wherein the oxidation step is performed at a pressure of greater than one atmosphere.

25. The method of claim 16, wherein the oxidation step is performed at a pressure of about 1 ksi to about 15 ksi.

* * * * *